March 6, 1962 J. P. COMBS ETAL 3,024,306

SIGNAL-TRANSLATING CHANNEL

Filed July 23, 1958 2 Sheets-Sheet 1

INVENTORS
Jimmy P. Combs
Peter H. Van Anrooy
BY Francis W. Crotty
ATTORNEY

March 6, 1962 J. P. COMBS ET AL 3,024,306

SIGNAL-TRANSLATING CHANNEL

Filed July 23, 1958 2 Sheets-Sheet 2

INVENTORS
Jimmy P. Combs
Peter H. Van Anrooy
BY Francis W. Crotty
ATTORNEY

United States Patent Office 3,024,306 Patented Mar. 6, 1962

3,024,306

SIGNAL-TRANSLATING CHANNEL

Jimmy P. Combs, Villa Park, and Peter H. van Anrooy, Itasca, Ill., assignors to Zenith Radio Corporation, a corporation of Delaware Filed July 23, 1958, Ser. No. 750,473
6 Claims. (Cl. 178—5.8)

This invention relates to signal-translating channels and more particularly to such channels which utilize automatic gain control circuits.

It is conventional practice in both radio and television receivers to utilize a system of automatic gain control (AGC) for regulating the overall gain of certain stages in an inverse relation relative to the level of the incoming signal. A typical AGC system may provide for the amplification and rectification of a portion of the incoming signal to provide a direct-current (D.-C.) bias potential for application to the radio-frequency (R-F) and/or intermediate-frequency (I-F) stages. When the level of the incoming signal increases, the AGC bias potential is caused to go more negative, thus decreasing the overall amplification of the gain-regulated stages. Conversely, as the level of the incoming signal decreases, the AGC bias level is made to increase in a positive direction and thus increase the overall gain of the controlled stages. Such operation has the desirable effect of approximating a constant signal level at the output circuit of the AGC-governed stages, thereby minimizing the need for readjustment of the receiver as the level of the incoming signal varies and when tuning from one station to another.

The desirable achievements of the AGC system are not without concomitant disadvantages, especially at high frequencies. For example, the apparent input reactance of certain grid-controlled vacuum tubes is a function of the bias level applied to one of the input electrodes with respect to another; a similar effect has been observed in transistors. In vacuum tubes the reactance, or the input capacity, appears to change as the space charge or cloud of electrons adjacent the cathode changes in position in response to a variation in the bias voltage applied between grid and cathode. In transistors, the apparent capacity at a back-biased emitter-base junction similarly varies as the level of the applied bias potential is varied. Such a change is particularly objectionable in sharply-tuned amplifiers, for example, the I.-F. channel of a wave-signal receiver. As the AGC bias voltage applied to one or more stages of the channel increases in the positive direction, in response to the reception of a weak signal, the apparent input capacity of the stage increases and lowers the effective resonant frequency of the tuned input circuit of that stage. Stated another way, the effect of the variation of input capacity is to shift the frequency-response characteristic of the channel to a lower point in the frequency spectrum. This effect is especially undesirable in the I.-F. stages of a television receiver for the reason that it causes the response to the video carrier to be decreased at the very time when maximum amplification is needed.

Certain efforts have been made to overcome the shift in frequency-response characteristic as the input bias level is varied. One approach has been to utilize an unbypassed cathode resistor, thereby providing negative feedback to the cathode circuit of the I.-F. stage. The negative feedback thus provided opposes the movement of the virtual cathode caused by the change in the bias voltage; such compensation tends to maintain the frequency-response characteristic in its preassigned location. However, this approach is not as flexible as desired for many installations. It is obviously desirable, for example, to be able to provide a form of over-compensation such that the response characteristic is shifted higher in the frequency spectrum in the presence of a weak incoming signal. Where that is accomplished, the video carrier appears at a higher point on the response curve and the sensitivity is enhanced during weak input signal conditions.

It is an object of the present invention therefore to provide a signal-translating channel in which the shifting of the frequency-response characteristic caused by variation in apparent input capacity of one or more stages is offset by a network which may contribute a compensating reactance variation sufficient to achieve over-compensation.

It is another object of the invention to provide a network that the amount of the compensating reactance variation can be adjusted to regulate the degree of compensation provided.

It is a further object of the invention to achieve the desired compensation by a network which is inexpensive, simple to fabricate, and easily adjusted in a television receiver.

A wave-signal receiver constructed in accordance with the invention includes a signal-translating channel which has a predetermined frequency-response characteristic. An amplifying device included in the channel has an input reactance which varies as a function of the applied bias potential, tending to shift the frequency-response characteristic lower in the frequency spectrum as the applied bias potential increases in the positive direction. The receiver includes means for developing an automatic gain control bias potential which varies inversely with the level of a received signal and for applying this potential to the amplifying device. Additionally, a passive signal feedback network coupled to the signal-translating channel contributes a compensating reactance variation, and this network includes means responsive to variations of the bias potential to regulate the reactance compensation and offset the tendency of the amplifying device to shift the frequency-response characteristic in the frequency spectrum.

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

Figure 1:
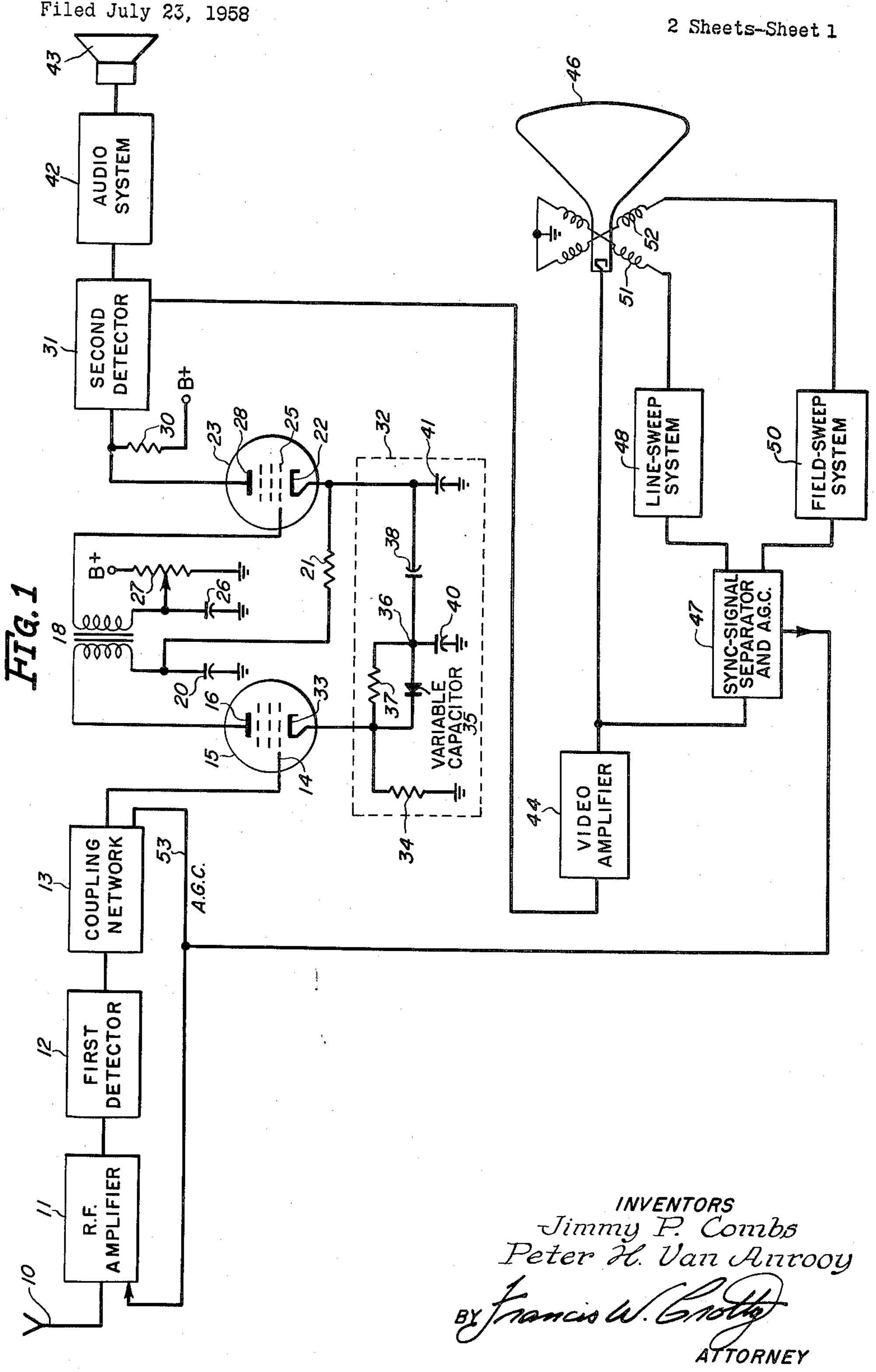
FIGURE 1 is a block diagram, partly schematic in form, of a television receiver incorporating one embodiment of the invention.

Referring now more particularly to FIGURE 1, the television receiver there represented is of the inter-carrier type and comprises a radio-frequency amplifier 11 of any desired number of stages having an input terminal coupled to antenna 10. Coupled in cascade with amplifier 11 is a first detector 12 and a signal-translating channel, specifically an intermediate-frequency channel, which has a predetermined frequency-response characteristic. This channel includes a first amplifying device 15 having input electrodes coupled to detector 12 through a coupling network 13 which will be considered to include the conventional resonant circuits tuned to the desired intermediate frequency of the receiver, and trap circuits employed for adjusting the frequency-response characteristic to preclude adjacent channel interference. As indicated above, this amplifying device is characterized by the fact that its input reactance varies as a function of the applied bias which adversely effects the frequency-response characteristic of the signal-translating channel in a manner to be described more fully hereinafter. A second amplifying device 23 is coupled through a coupling transformer 18 to complete the intermediate-frequency channel. A network 32, coupled to the I.-F. channel, takes the form of a feedback circuit between amplifying stages 15 and 23 for the purpose of introducing a compensation to be considered in detail hereinafter.

The output terminals of this channel are coupled to a video or second detector 31 having one output circuit coupled to a video amplifier 44 of any desired number of stages. The video amplifier is connected to the input circuit of an image-reproducing device, specifically, a cathode-ray picture tube 46. It is also coupled to a synchronizing signal separator 47, which will also be considered to include a source of AGC potential. One output terminal of the sync signal separator is coupled to the synchronizing or input circuit of a line-sweep system 48 and another output terminal is likewise coupled to a synchronizing circuit of a field-sweep system 50. The output circuits of these systems are connected with line and field deflection coils 51 and 52, which are associated with the image-reproducing device in the usual way. The AGC supply provisions of unit 47 constitute means for developing an automatic gain control bias potential which varies inversely with the level of a received signal. An AGC bus 53 is coupled to the gain-controlled amplifiers 11 and 15 for applying that potential thereto.

An inter-carrier component, which is a frequency-modulated signal conveying the audio information, is obtained in video detector 31 through a circuit (not shown) selective to the inter-carrier component of 4.5 megacycles. That component is coupled to an audio system 42, which comprises any desired number of stages of audio amplification and detection, and is in turn coupled to a sound reproducer or loud speaker 43.

Aside from the construction and function of network 32, the described arrangement constitutes a conventional television receiver of the inter-carrier type. Its structural arrangement and operation are well understood and may therefore be considered in summary fashion. The television signal intercepted by antenna 10 and selected by R.-F. amplifier 11 is amplified and delivered to first detector 12 wherein it is converted to an intermediate signal properly related in frequency to the frequency of the I.-F. channel. The sound carrier is located higher in the frequency spectrum than the video carrier as the composite television signal is received at the antenna. Because the oscillator section (not shown) of first detector 12 operates in conventional fashion at a frequency higher than the frequency of the received signal, the relative positions of the sound and video carriers in the frequency spectrum are interchanged at the output side of first detector 12. The I.-F. signal is applied from detector 12 through coupling network 13 and, after amplification in stages 15 and 23, is finally detected in second detector 31. The video signal component is amplified in amplifier 44 and applied to the input circuit of picture tube 46 to intensity modulate the electron beam thereof. At the same time, the composite video signal is delivered to sync signal separator and AGC unit 47, wherein the synchronizing information is separated from the video content and is applied to synchronize sweep systems 48 and 50. These systems develop line and field deflection signals which energize deflection coils 51 and 52 and deflect the electron beam of tube 46, causing its traverse in a series of fields of parallel lines. Thus the image is reproduced in conventional manner.

The inter-carrier component developed in second detector 31 is delivered to the audio system 42 wherein the audio information is derived and amplified, and is then reproduced through speaker 43.

The AGC source of unit 47 develops a control potential having amplitude variations related to variations of the level of the received signal, and this potential controls the gain and operating conditions of amplifiers 11 and 15, varying their gain inversely with respect to signal level variations. Accordingly, the signal delivered to second detector 31 is maintained within a relatively narrow range of amplitude variations, notwithstanding a much wider range of variations in the level of the received signal.

It has been explained hereinbefore that amplifier 15, for example, manifests a change in input reactance as a function of the applied AGC potential. This reactance variation is objectionable, particularly under weak signal conditions, for the reason that the change in reactance is in such a sense or direction as to shift the frequency-response characteristic of the channel lower in the frequency spectrum. Network 32 includes means responsive to similar variations in bias potential for contributing to the channel a compensating reactance variation to combat the tendency of the frequency-response characteristic of the channel to shift in the frequency spectrum.

More particularly, network 32 provides a feedback path from cathode 22 of amplifier 23 to cathode 33 of amplifier 15. It comprises a condenser 41 through which cathode 22 is returned to ground, and an additional shunt condenser 40. The series components of the network include a condenser 38 coupled in series with a variable capacitor 35, which, in turn, is shunted by a resistor 37. The series network connects to the junction of cathode 33 and the high potential terminal of a cathode resistor 34, returning that cathode to ground. Capacitor 35 is a non-linear element and may be a crystal or semi-conductor device exhibiting a value of capacitance which varies as a function of impressed voltage. More particularly, it is of the type for which the capacitance decreases as the applied voltage becomes more positive while its capacitance increases as the applied voltage becomes more negative. As to polarity, it is connected in the feedback circuit in such a way that the value of capacitance decreases as the magnitude of the feedback signal increases.

Amplifiers 15 and 23 are connected in series or cascade in respect of the D.-C. path which extends from a source of operating potential, indicated B+, through a resistor 30, the anode-cathode path of tube 23, resistor 21, the primary winding of coupling transformer 18, and the space charge path of tube 15, which is returned to ground thorugh cathode resistor 34. Condenser 20 is a radio-frequency bypass. The operating bias for the control electrode 25 of tube 23 is obtained from a source B+ and a potential divider 27, having an adjustable tap bypassed to ground by a condenser 26.

Figures 2, 3:
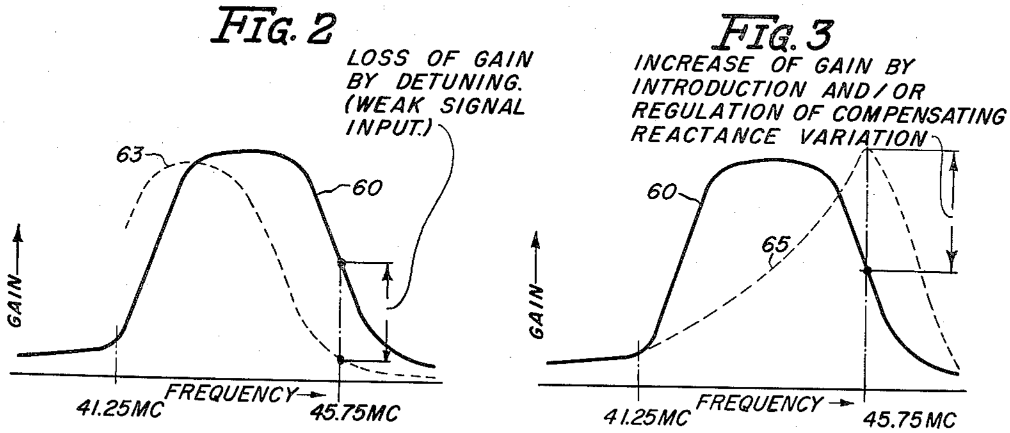
FIGURES 2 and 3 are graphical illustrations useful in understanding the operation of the invention.

In considering the function of network 32 in its role of contributing a reactance variation to compensate for variations in the input capacitance of tube 15, particularly during weak signal operating conditions, it will be assumed initially that a signal of average intensity is being selected by R.-F. amplifier 11 and translated to tube 15. For this condition, the AGC potential has an average or reference level and establishes an average gain or conductivity of controlled amplifiers 11 and 15. The input capacitance of tube 15 has a particular value and the feedback current traversing network 32 likewise has a reference value. In the face of these operating conditions the I.-F. channel has a certain frequency-response characteristic positioned in a desired location within the frequency spectrum and shaped in well-known manner by proper selection of the operating parameters. The frequency-response characteristic is represented in FIGURE 2 and, since this is the characteristic of the intermediate-frequency channel, it prevails for all conditions of reception if perfect compensation for variation in input tube reactance is achieved. The characteristic is represented by curve 60 and its position in the frequency spectrum is such that the carrier frequency for the video information occurs at 45.75 megacycles; the video frequency ordinate intercepts the curve on a sloping portion of the characteristic where the response level varies inversely with frequency. The sound carrier, which in accordance with the signal specifications of the Federal Communications Commission is spaced 4.5 megacycles from the video carrier, occurs at 41.25 megacycles and the sound frequency ordinate intercepts the characteristic on the lower portion of its alternate slope.

If it be assumed that amplifier 11 selects a television signal which is weak or has a relatively low intensity compared with the initially assumed conditions, the AGC potential developed in unit 47 is decreased a corresponding amount; that is, the AGC potential is increased in a positive direction. This is manifested in a reduction in the bias potential of I.-F. amplifier 15 and a consequent variation of input capacitance; specifically, its input capacitance increases. This capacitance variation, considered alone, is analogous to detuning of the I.-F. selector circuit in a direction which tends to displace the response characteristic of the channel lower in the frequency spectrum, as indicated in the broken line curve 63 of FIGURE 2. If this condition is permitted to persist, the response of the receiver to the video carrier is undesirably decreased as is apparent from the intersection of the ordinate line 45.75 mc. with curve 63. But, in accordance with the subject invention, network 32 contributes a compensating reactance variation to preclude this undesirable result.

The decrease of AGC potential incident to the reception of a weak signal causes the gain and conductivity of controlled amplifiers 15 and 23 to increase and also causes a related increase in intensity of the feedback signal traversing network 32. The potential impressed across variable capacitance 35 is increased, resulting in a decrease in its capacitance. As a consequence both the magnitude and phase of the feedback signal are modified, and, by appropriate proportioning of the parameters of the feedback circuit, such modification may compensate the change in input capacitance of tube 15 to any extent desired. If the change in feedback signal, which because of its phase relation is analogous to the contribution of an additional reactance in the input circuit of tube 15, compensates precisely for the tendency of the frequency-response characteristic to shift, conditions remain as indicated by full line curve 60 of FIGURE 2. A lesser amount of compensation results in an intermediate positioning of the response characteristic between the positions of curves 60 and 63.

Obviously it is desirable to increase the sensitivity of the receiver during weak signal conditions and this of course is the effect of the AGC system, but it may be augmented by over-compensation afforded by network 32. Where the parameters of this network cause the feedback signal to effect over-compensation, the frequency-response characteristic of the I.-F. channel, during weak signal conditions, shifts upwardly in the frequency spectrum as represented by broken line curve 65 of FIGURE 3. The interceptions of ordinate 45.75 mc. with curves 60 and 65 clearly show the increased sensitivity of the signal-translating channel provided by the invention when weak signals appear at antenna 10. In the remainder of the specification and in the appended claims the term "offset" is used to describe the action of the invention in combatting the tendency of conventional circuits to shift the frequency-response characteristic as the AGC bias potential varies. "Offset" is deemed to include not only over-compensation but also all the various degrees of compensation attainable with the inventive circuit.

In the foregoing discussion of the compensation afforded by network 32 it has been stated that the network in effect contributes a compensating reactance variation to the signal channel. This results because of the signal conditions in the input circuit of amplifier 15 due to the presence of two signal components: (1) the intermediate-frequency signal delivered from first detector 12, and (2) a feedback signal supplied by network 32 and having a controlled phase relation with respect to the first-mentioned signal. These signal components add vectorially and establish in the input circuit of amplifier 15 a signal of a phase which is specifically different from that contributed by detector 12 and which may be likened to the effect of physically changing the tuning of the I.-F. selector circuits. In other words, its effect is precisely the same as that resulting from a physical change of reactance in the input circuit in a sense opposing the reactance variation produced because the input capacitance of tube 15 varies with variations of AGC potential.

When an input signal above the average or reference level is intercepted at antenna 10, the AGC bias potential produced by stage 47 increases, i.e., becomes increasingly negative. This more negative bias potential reduces the conductivity of stages 11 and 15. Accordingly I.-F. amplifiers 15 and 23 become less conductive and the level of the feedback signal is also decreased. The decreased potential thereby developed across resistor 37 effects an increase in the capacity of capacitor 35, thus lowering the impedance exhibited by network 32 to the feedback signal. However, the reduced gain of the stages 15 and 23 is so great in proportion to the increased capacity of capacitor 35 that the feedback signal, when a strong signal appears at antenna 10, can be neglected for practical purposes.

Although the compensating network 32 is illustrated in a feedback path for a stage which is subject to the variation of input capacitance caused by application of a bias potential increasing in the positive direction, it is understood that the compensating network need not be coupled to the same stages which cause the detuning. The network may be coupled to other stages of the controlled channel and effect correction of the overall frequency-response characteristic by suitably modifying the characteristics of the particular stages and tuned circuits to which it is coupled. It has been found advantageous, however, to couple the network 32 to at least one of the stages which exhibits a variation of input capacitance, because this circuit arrangement has proved simple to align in a television receiver.

Figure 4:
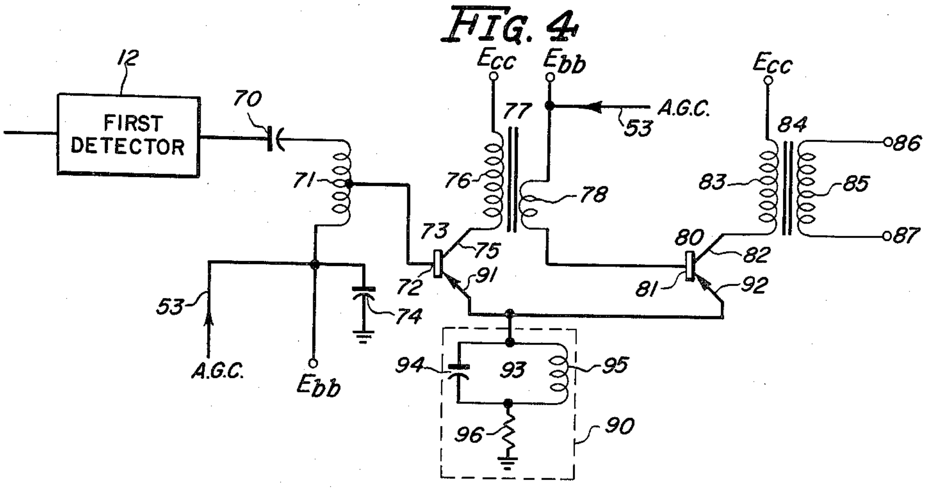
FIGURE 4 is a schematic diagram, partly in block form, depicting another embodiment of the invention.

FIGURE 4 depicts an embodiment of the invention which has proved effective in providing the proper reactive compensation in transistorized I.-F. amplifier circuits. A coupling capacitor 70 is connected between the output of first detector 12 and a stepdown transformer 71. The other terminal of transformer 71 is connected to a source of unidirectional bias potential, conventionally designated $E_{bb}$, for applying a suitable potential over a portion of transformer 71 to the control electrode, or base, 72 of transistor 73. In the illustrated embodiment, transistor 73 is of the PNP type; it will be understood, however, that transistors 73 and 80 may be of either the PNP or NPN type. The potential source designated $E_{bb}$ is bypassed by capacitor 74, connected to the lower terminal of transformer 71, and the AGC lead 53 is connected to the same terminal.

The output electrode, or collector, 75 of transistor 73 is coupled to one terminal of the primary winding 76 of a stepdown transformer 77; the opposite terminal of primary winding 76 is connected to a source of unidirectional operating potential, $E_{cc}$, for collector 75. The exact potential values and the correct polarities for $E_{bb}$ and $E_{cc}$ depend, among other considerations, upon the type of transistor utilized and upon the physical values of the circuit parameters, in addition to the performance desired of the circuits.

One terminal of the secondary winding 78 of transformer 77 is coupled to potential source $E_{bb}$ and, if AGC is applied to transistor 80, AGC lead 53 is also coupled to the upper terminal of winding 78. The other terminal of secondary winding 78 is coupled to the base 81 of transistor 80, which also is depicted as a PNP transistor. The collector 82 of transistor 80 is coupled through the primary winding 83 of transformer 84 to source $E_{cc}$; the secondary winding 85 is coupled to a pair of output terminals 86 and 87.

In accordance with the invention, a reactance network 90 is coupled between input electrode, or emitter, 91 of transistor 73 and emitter 92 of transistor 80. Emitters 91 and 92 are connected together and also to one terminal of a parallel resonant circuit 93, including a capacitor 94 and an inductor 95, tuned to resonate at approximately the center frequency of the I.-F. pass band. A resistor 96 is connected between the lower terminal of parallel circuit 93 and a point of reference potential, such as ground.

The operation of network 90 is analagous to that of network 32 shown in FIGURE 1. Normally the emitters of transistors 73 and 80 are separately coupled to ground. In accordance with the invention, the emitters 91 and 92 are coupled together and, through network 90, are coupled to ground. Accordingly a feedback path from transistor 80 to transistor 73 is provided; the signal appearing at emitter 92 is also applied to emitter 91 of transistor 73. As the frequency of the signal coupled through transistor 73 is varied by reason of AGC potential changes, the frequency of the signal applied to tuned circuit 93 moves away from its resonant frequency, causing circuit 93 to exhibit a reactance and thus varying the phase of the feedback signal. The phase of the feedback signal applied to emitter 91 is such that, compared to the phase of the signal applied to the base 72 of transistor 73, the net effect is to produce a compensating reactance variation in the input circuit of transistor 73. As in the embodiment of FIGURE 1, the effect of the compensating reactance variation is to offset the increase of input capacitance in transistor 73 as the applied AGC signal increases in a positive direction. Thus the embodiment of FIGURE 4 produces the same type of compensation as is illustrated by curve 65 in FIGURE 3.

Figure 5:
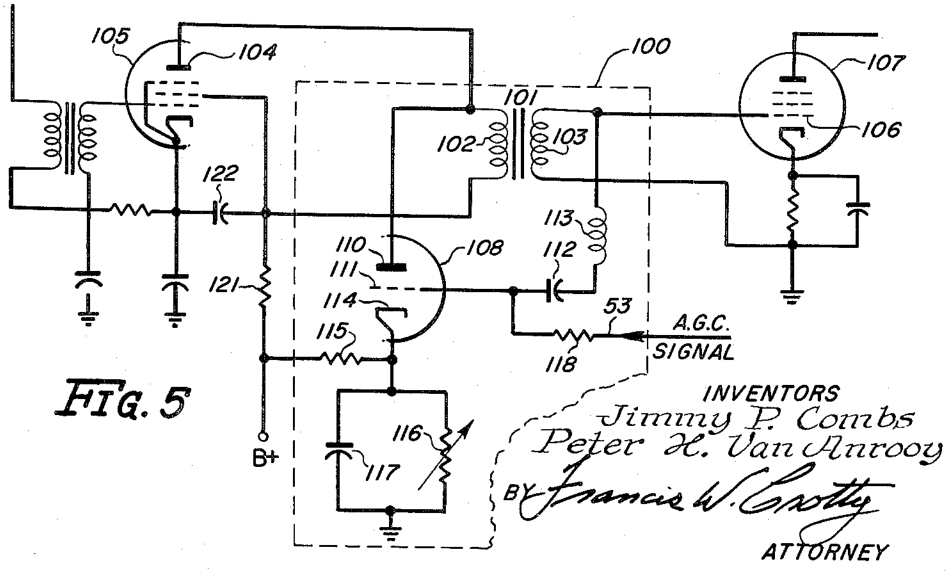
FIGURE 5 is a partial schematic diagram illustrating yet another embodiment of the invention.

In FIGURE 5 still another embodiment of the invention is illustrated. As there shown, compensating network 100 includes a reactive element or coupling transformer 101, comprising a primary winding 102 and a secondary winding 103, connected between the anode or output electrode 104 of I.-F. amplifier 105 and the control electrode, or grid, 106 of I.-F. amplifier 107. Transformer 101, conventionally a tightly-wound bifilar structure, can be considered as a single inductance which, with its distributed capacitance, forms a tuned coupling circuit between amplifiers 105 and 107; this coupling circuit has a certain "Q." In accordance with the invention, a variable reactance tube 108 is connected in parallel with this transformer to both increase the "Q" of the coupling circuit and contribute a compensating reactance variation as a function of the AGC signal applied to the signal channel, thus to offset the increased capacitance of the amplifier stages produced by the AGC bias variation.

More specifically, the anode 110 of variable reactance tube 108 is coupled to the primary winding 102, and the control grid 111 is connected through capacitor 112 and inductor 113 to the secondary winding 103. The cathode 114 is coupled through resistor 115 to a source of unidirectional operating potential conventionally designated B+. Additionally, an adjustable bias potentiometer 116, bypassed by capacitor 117, is connected between cathode 114 and ground.

Further in accordance with the invention, the AGC bias potential is applied from conductor 53 over resistor 118 to the control grid 111 of variable reactance tube 108. When signals of strong or average level are received, a bias potential sufficient to maintain tube 108 non-conducting is applied over resistor 118 to control grid 111. In response to receipt of weak signals at the antenna of the receiver, a bias potential which increases in the positive direction is applied over conductor 53 and resistor 118 to effect conduction in variable reactance tube 108, thereby introducing a phase-shifted feedback signal into the signal-translating channel. A feedback path is provided from the secondary winding 103 of transformer 101, through reactor 113, blocking capacitor 112, the space current path of tube 108, to the primary winding 102 of transformer 101. The feedback signal is shifted in phase by the inductor 113, and the phase of the feedback signal is such as to compensate for the detuning in the signal channel caused by the increase of input capacitance of the amplifier tubes. As the applied AGC bias potential increases in a positive direction, tube 108 conducts more heavily and the phase-shifted signal contributed thereby similarly increases in magnitude. The feedback circuit in effect contributes a compensating reactance variation to the signal-translating channel, regulated by application of the AGC bias potential over resistor 118, to offset the increase of input capacitance exhibited by the AGC-regulated stages.

An additional form of compensation is provided by the feedback signal introduced through reactance tube 108 into the signal-translating channel. The feedback signal not only has a component which provides a compensating reactance variation, but also includes a component which introduces an apparent negative resistance into the coupling circuit including transformer 101. That is, the feedback signal may be separated into two components; one of the components is in quadrature with the reference signal, and the other component is in phase opposition to the reference signal. It is the latter component which introduces an apparent negative resistance into the tuned coupling circuit. Accordingly the "Q" of the tuned coupling circuit is increased to provide increased gain of the video carrier-frequency signal under these conditions, contributing to the formation of the frequency-response characteristic 65 shown in FIGURE 3.

When the feedback networks of FIGURES 1 and 4 are utilized in practicing the invention by incorporating such circuits in the I.-F. amplifier channel of a television receiver, the tuned circuits between the I.-F. stages should be aligned on an input signal of sufficient amplitude to just overcome the "snow" representation indicative of weak signal reception. This may be a threshold signal of the order of 20 decibels under a 500 microvolt level at the input circuit of the first detector. When thus adjusted, the effect of the feedback network becomes readily noticeable as signals below the threshold level are received, and the response curve of the I.-F. channel is shifted as illustrated in FIGURE 3 to boost the response at the video carrier frequency and preclude the presentation of a snowy or spotty image.

The embodiment of FIGURE 5 has proved simple of installation and is somewhat easier to align than are the feedback network circuits of FIGURES 1 and 4. In FIGURE 5, the adjustable bias potentiometer 116 of the network 100 is adjusted so that, conjointly with the potential established by the resistor 115, the variable impedance tube 108 conducts when weak signals are intercepted by the receiver and compensates for the detuning universally present in prior art receivers because of the apparent increase in capacitance caused by the application of an increased positive bias potential to the AGC-governed stages.

To permit others to readily practice the invention, a table of physical values for the circuit elements of the various embodiments of the invention is given below. These values have been proved in actual operation of the illustrated circuits and are therefore given as typical values; other circuit variations will no doubt be suggested to those skilled in the art. Although resistor 121 and capacitor 122, shown in FIGURE 5, are not part of network 100, their physical values have been slightly modified from their conventional values, and hence are listed in the table below.

*FIGURE 1*

| | |
|---|---|
| Capacitor 35 | Varicap V27 (27 micromicrofarads at —4 volts). |
| Capacitor 38 | 15 micromicrofarads. |
| Resistor 37 | 15 megohms. |
| Capacitor 40 | 27 micromicrofarads. |
| Capacitor 41 | 0.0015 microfarad. |

*FIGURE 4*

| | |
|---|---|
| Transistors 73 and 80 | Texas Instruments 2N623 or Philco 2N502. |
| Capacitor 94 | 7 micromicrofarads. |
| Inductor 95 | 1.2 microhenries. |
| Resistor 96 | 4,700 ohms. |

*FIGURE 5*

| | |
|---|---|
| Tubes 105 and 108 | 8AW8A. |
| Capacitor 112 | 0.001 microfarad. |
| Inductor 113 | 3.3 microhenries. |
| Resistor 115 | 100 kilohms. |
| Potentiometer 116 | 0–10 kilohms. |
| Capacitor 117 | 470 micromicrofarads. |
| Resistor 118 | 470 ohms. |
| Resistor 121 | 330 ohms. |
| Capacitor 122 | 800 micromicrofarads. |

While particular embodiments of the present invention have been shown and described, it is apparent that changes and modifications may be made therein without departing from the invention in its broader aspects. The aim of the appended claims, therefore, is to cover all such changes and modifications as fall within the true spirit and scope of the invention.

We claim:

1. A wave-signal receiver comprising: a signal-translating channel having a predetermined frequency-response characteristic; an amplifying device included in said channel, having an input reactance which varies as a function of the applied bias potential and tends to shift said characteristic lower in the frequency spectrum as said bias potential increases in a positive direction; means for developing an automatic gain control bias potential which varies inversely with the level of a received signal and for applying said potential to said device; and a passive signal feedback network coupled to said channel for contributing thereto a compensating reactance variation and including means responsive to variations in said bias potential to regulate the reactance compensation and offset the tendency of said amplifying device to shift said frequency-response characteristic in the frequency spectrum.

2. A wave-signal receiver according to claim 1 which includes a second amplifying device, in which each of said devices is an electron-discharge device having a cathode, a control grid and an anode, and in which said network includes: a non-linear capacitor coupled between a junction point and the cathode of one of said devices; a resistor coupled in parallel with said non-linear capacitor; a second capacitor coupled between said junction point and the cathode of the other device; a third capacitor coupled between a point of reference potential and said junction point; and a fourth capacitor coupled between said point of reference potential and the junction of the second capacitor and the cathode of said other device.

3. A wave-signal receiver according to claim 1 which includes a second amplifying device, in which each of said devices is a transistor having emitter, base and collector electrodes and in which said network comprises: a two-terminal parallel-resonant circuit including an inductor coupled in parallel with a capacitor, one terminal of said parallel circuit being coupled to the emitter electrode of each transistor; and a resistor coupled between a point of reference potential and the other terminal of said parallel circuit.

4. A television receiver comprising: an intermediate-frequency amplifying channel, having a predetermined frequency-response characteristic, for amplifying both the video carrier-frequency signal and the audio carrier-frequency signal of a received composite television signal; an amplifying device included in said channel, having an input reactance which varies as a function of the applied bias potential, and tends to shift said characteristic lower in the frequency spectrum and reduce amplification of the video carrier-frequency signal as said bias potential increases in a positive direction; means for developing an automatic gain control bias potential which varies inversely with the level of the received composite television signal and for applying said potential to said device; and a passive signal feedback network coupled to said channel for contributing thereto a compensating reactance variation, including means responsive to variations in said bias potential to regulate the reactance compensation and offset the tendency of said amplifying device to shift the frequency-response characteristic in the frequency spectrum.

5. A wave-signal receiver comprising: a signal-translating channel having a frequency-response characteristic normally having a reference position in the frequency spectrum and including a portion over which the response varies inversely with frequency; an amplifying device included in said channel, having an input reactance which varies as a function of the applied bias potential and tends to shift said characteristic lower in the frequency spectrum as said bias potential increases in a positive direction; means for developing an automatic gain control bias potential which varies inversely with the level of a received signal and for applying said potential to said device; and a passive signal feedback path coupled to said channel including a variable reactance responsive to variations in said bias potential to vary its effective reactance and shift said frequency-response characteristic higher in the frequency spectrum than its aforesaid reference position to increase the response of the receiver to signals of low intensity.

6. A television receiver comprising: an intermediate-frequency signal-translating channel having a frequency-response characteristic normally having a reference position in the frequency spectrum and including a portion over which the response varies inversely with frequency for translating the video carrier signal at a given response; an amplifying device included in said channel, having an input reactance which varies as a function of the applied bias potential and tends to shift said characteristic lower in the frequency spectrum as said bias potential increases in a positive direction to translate the video carrier signal at a lower response; means for developing an automatic gain control bias potential which varies inversely with the level of a received signal and for applying said potential to said device; and a passive signal feedback path coupled to said channel, including a reactance responsive to variations in said bias potential to vary its effective reactance and over-compensate the effect of said variation in input reactance to shift said frequency-response characteristic higher in the frequency spectrum than its aforesaid reference position and translate said video carrier signal at a higher response.

References Cited in the file of this patent

UNITED STATES PATENTS

| | | |
|---|---|---|
| 2,540,532 | Koch | Feb. 6, 1951 |
| 2,699,497 | Amos | Jan. 11, 1955 |
| 2,901,537 | Comninos | Aug. 25, 1959 |
| 2,917,572 | Stubbe | Dec. 15, 1959 |